United States Patent [19]

Nirschl

[11] 4,050,019
[45] Sept. 20, 1977

[54] RANGE SWITCHING CIRCUIT FOR SOLID STATE ELECTROMETER

[75] Inventor: Joseph C. Nirschl, West Long Branch, N.J.

[73] Assignee: The United States of America as represented by the Secretary of the Army, Washington, D.C.

[21] Appl. No.: 708,665

[22] Filed: July 26, 1976

[51] Int. Cl.$^2$ .................... G01R 15/08; G01R 1/30
[52] U.S. Cl. ........................... 324/115; 324/123 R
[58] Field of Search ................. 324/115, 123 R, 131

[56] References Cited

U.S. PATENT DOCUMENTS 2,511,562  6/1950  Bresee ................................. 324/115
3,187,323  6/1965  Flood et al. ......................... 324/115

Primary Examiner—Rudolph V. Rolinec
Assistant Examiner—Ernest F. Karlsen
Attorney, Agent, or Firm—Nathan Edelberg; Sheldon Kanars; Edward Goldberg

[57] ABSTRACT

A range switching circuit for a solid state electrometer, e.g., for use in a radiacmeter, includes a substantially symmetrical circuit having an n-channel MOSFET and an NPN transistor in one branch and a p-channel MOSFET and a PNP transistor in the other branch. The electrometer includes an operational amplifier with two high value resistors in the feedback path. A latching reed relay selectively shorts out one of the feedback resistors when one of the transistors is gated on by the corresponding MOSFET.

5 Claims, 2 Drawing Figures

RANGE SWITCHING CIRCUIT FOR SOLID STATE ELECTROMETER

GOVERNMENT LICENSE

The invention described herein may be manufactured and used by or for the Government for governmental purposes without the payment of any royalties thereon or therefor.

BACKGROUND OF THE INVENTION

1. Field of the Invention

Broadly speaking, this invention relates to electrometers. More particularly, in a preferred embodiment, this invention relates to a range switching circuit which permits the construction of an electrometer having only non-critical, external circuit connections.

2. Discussion of the Prior Art

Solid state electrometers which employ field-effect-transistors to attain a high input impedance have proved uniquely suitable for the measurement of extremely low currents; for example, currents in the picoamp range such as emanate from ionization chambers which are exposed to ionizng radiation. A high degree of accuracy and stability may be attained with such electrometers, for example, by the use of negative feedback obtained from high value resistors inserted into the feedback loop. Such an arrangement, which is known in the prior art, makes the signal stability primarily a function of the stability of the passive components in the feedback loop (e.g., the high value resistors). By the choice of suitable resistors, the temperature stability over the range of interest (say, −40° C to +60° C) may be held to within ±10% of room temperature which is generally considered acceptable. Also, with this arrangement the electrometer performance is predictable and highly reproducible.

One of the problems affecting feedback-type electrometers is the need to provide range switching to cover several decades of input signal (i.e., radiation dose rates). In commercial, laboratory-type, electrometers it is customary to use a special, high-impedance range switch, for example, a teflon-insulated or ceramic switch, which, in conjunction with a plurality of high value resistors connected to the range switch, permits the electrometer to measure multiple ranges of input current. However, for use in certain critical environments, or where a compact instrument is needed, the use of such a range switch is undesirable; furthermore such switches are not readily available at low cost. Also, the design of a ruggedized ionchamber module containing all the high-impedance components is compromised when external pin connections must be provided for the range resistors, due to potentially troublesome external leakage paths. Put another way, the external contamination of the ion chamber module in a field environment which is possible with such an arrangement can severely degrade the instrument's performance. It is, thus, an object of this invention to provide a range switching arrangement which circumvents the aforementioned problems, thereby permitting construction of an ionization-chamber module having only non-critical, external circuit connections. Another object of this invention is to provide a switching arrangement which is compatible with battery-powered, portable equipment, i.e., a switching arrangement that consumes minimal power.

SUMMARY OF THE INVENTION

The above and other problems have been solved by the instant invention which, in a preferred embodiment, comprises an electrometer including an operational amplifier having an input connected to the source of the current to be measured, means for applying a feedback signal from the output of the operational amplifier to the input to control the gain thereof, means connected to the output of the operational amplifier for indicating the amplitude of the output signal therefrom, means for altering the sensitivity of the indicating means thereby to provide a plurality of measurement ranges for the electrometer, and means, activated by the operation of the sensitivity altering means, for changing the parameters of the feedback applying means thereby to alter the gain of the operational amplifier.

The invention and its mode of operation will be more fully understood from the following detailed description when taken with the accompanying drawings in which:

DETAILED DESCRIPTION OF THE INVENTION

Figure 1:
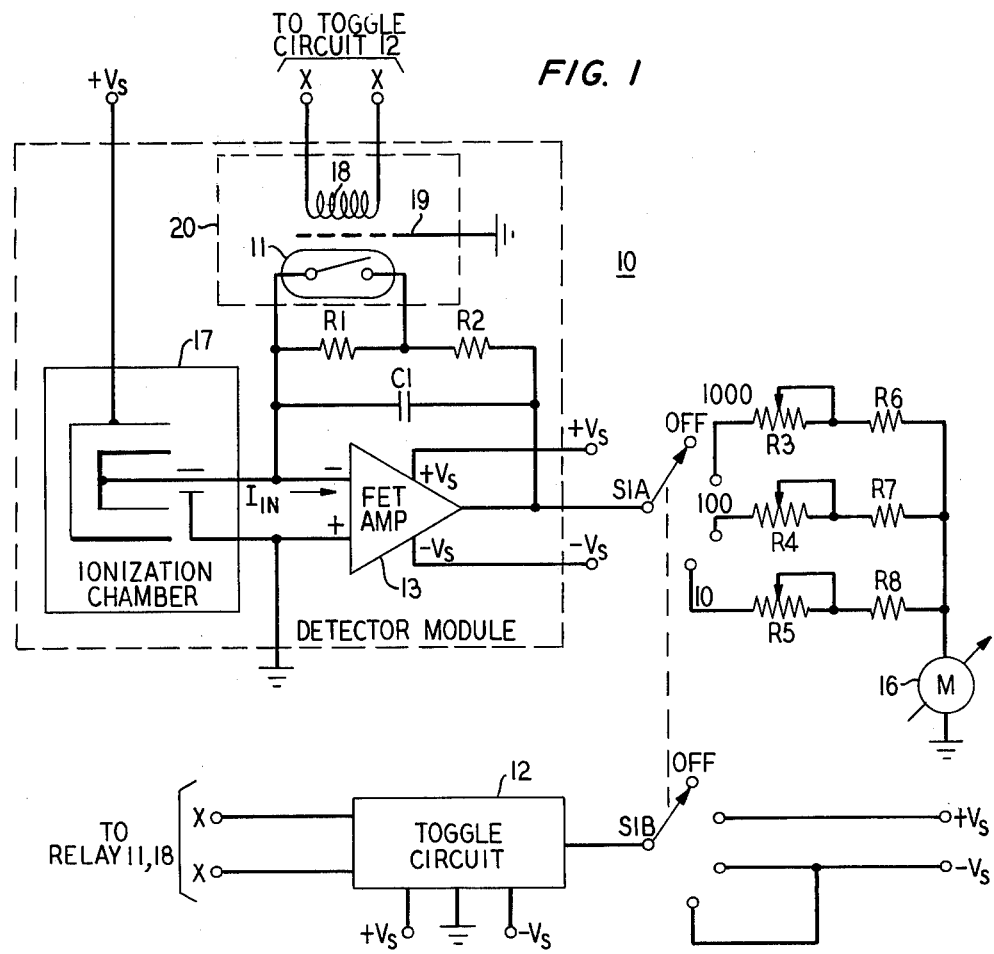
FIG. 1 is a block schematic diagram of an illustrative solid-state electrometer according to the invention.

FIG. 1 depicts an illustrative, solid-state electrometer 10 according to the invention. As will be explained below, electrometer 10 includes a latching-type, magnetic reed relay 11 in conjunction with a novel toggle circuit 12. The electrometer shown takes advantage of the capability of an FET amplifier 13 to operate with an output signal swing of alternately 1 and 10V volts (approximately), full scale. In this particular illustrative example, three dose rate ranges are indicated with the use of only one latching magnetic reed relay. However, alternate embodiments of the invention having more ranges and employing two or more reed relays, or fewer ranges, can readily be derived by one skilled in the art from the basic circuit shown in FIG. 1.

As shown, radiacmeter 10 comprises a detector module 14, a range selector switch S1 connected, via resistors R3–R8, to a linear meter movement 16, and a toggle circuit 12. Not shown in the drawing are means for supplying the operating potentials +Vs and −Vs, +12V and −12V d.c., respectively, in the illustrative embodiment. As will be discussed later, detector module 14 includes an FET amplifier 13 (or high-impedance input portion thereof) having an ionization chamber 17 connected to the inputs thereof and a feedback loop including high value resistors R1 and R2. A latching-type, miniature, magnetic reed relay 11 and the armature coil 18 thereof are also included in detector module 14 to selectively short-out resistor R1 in the feedback path. To minimize any leakage current from the armature coil, an electrostatic shield 19, for example, a thin cylindrical layer of grounded non-magnetic material, is interposed between the coil 18 and the glass body of the magnetic reed relay 11. Likewise, to reduce the effects of stray magnetic fields, the entire relay assembly is enclosed in magnetic shielding material 20, e.g., Mumetal.

An important aspect of this invention is that only one, non-critical, connection is needed from external range switch S1 to detector module 14 to accomplish the range switching function. The detector module 14, including ionization chamber 17, amplifier 13, resistors R1 and R2 and reed relay 11, are advantageously completely sealed (e.g., RTV potted) as indicated by a dashed line in the schematic. All lead connections to module 14 are low-impedance, non-critical, connections. Thus, a relatively inexpensive bakelite, or similar material, switch can be used for range switch S1 instead of the high quality teflon or ceramic range switch previously discussed.

In operation, the input current $I_{in}$ from ionization chamber 17 flows essentially through feedback resistors R1 and R2 of FET operational amplifier 13, in what is essentially the conventional current-to-voltage converter configuration for an operational electrometer circuit. The simple equation $\rho_o = I_{in} \times R_f$ governs the operation of this circuitry, to a high degree of accuracy. The magnitude of the feedback resistor $R_f$ is either the sum of R1 and R2 (relay 11 open) or R2 (relay 11 closed). Consequently, the output voltage of the electrometer will be either $I_{in} \times (R1 + R2)$, or $I_{in} \times R2$. For a typical ionization chamber (active volume 20 cu cm), a full scale current of $I_{in} = 1.8 \times 10^{-11}$ amperes is generated by a full scale dose-rate range of 10 rad per hour, with higher ranges producing correspondingly higher currents (disregarding a minor non-linearity in response of the ionization chamber). Therefore, in the illustrative example shown in FIG. 1, the following nominal values apply:

TABLE 1

| Dose Rate Range Rad/hr (full scale) | $I_{in}$ picoampere | $R_f$ (ohms) | $\rho_o$ Volt (approx.) |
|---|---|---|---|
| 10 | 18 | $5.5 \times 10^{10}$ | 1.0 |
| 100 | 180 | $5.5 \times 10^{10}$ | 10.0 |
| 1000 | 1800 | $5 \times 10^{9}$ | 9.0 |

It is apparent from Table 1 that $\rho_o$, the full scale output of amplifier 13, alternates between 1 and 10 or 9 volts. Consequently, calibration resistors R3 through R5 are adjusted accordingly. It will also be noted that the required short-circuiting of the R1 portion of the feedback resistance $R_f$ is accomplished by means of relay 11 and its associated armature winding 18.

Figure 2:
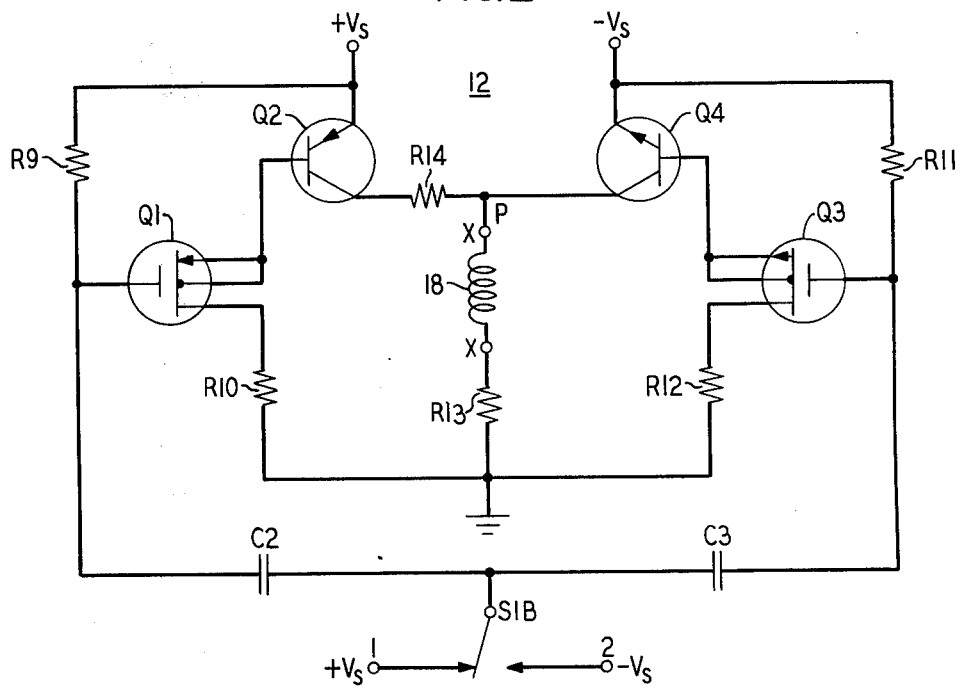
FIG. 2 is a schematic diagram of an illustrative toggle circuit for use with the electrometer shown in FIG. 1.

A critical aspect of the operation of such a latching reed relay is the amount of power required for relay actuation. Although the use of a magnetic, latching-type reed relay may overcome the problem of the appreciable quiescent power consumed by a conventional non-latching reed relay, the apparatus used to energize the reed relay is crucial for a portable, battery-powered, electrometer where minimum power demand is desired. A polarity-sensitive toggle circuit for driving the latching reed relay is shown in FIG. 2. This illustrative circuit accomplishes the objective of minimal power demand and is consistent with micropower portable equipment and is in itself a novel feature of this invention.

As shown, toggle circuit 12 comprises an essentially symmetrical circuit with an n-channel enhancement type MOSFET Q3 and an NPN transistor Q4 in the right-hand branch and a p-channel enhancement type MOSFET Q1 and a PNP transistor Q2 in the left-hand branch. The gate of transistor Q1 and the emitter of transistor Q2 are connected to +Vs while the gate of transistor Q3 and the emitter of transistor Q4 are connected to −Vs. The collectors of transistors Q2 and Q4 are both connected to the armature coil 18 of latching magnetic reed relay 11 (FIG. 1).

The purpose of toggle circuit 12 is, of course, to momentarily energize armature coil 18 with current flowing through the coil in one direction to achieve latching action (i.e., closure of the contacts of relay 11); and to accomplish the opposite effect, i.e., unlatching, with a current pulse of opposite polarity. In the quiescent mode, that is when relay 11 is either latched or unlatched, the toggle circuit should be passive, consuming negligible power from the power supplies +Vs and −Vs. These goals are well satisfied with the circuit shown in FIG. 2 which takes advantage of the bipolar power supply required in any event to operate amplifier 13. Switch S1B is represented here in simplified form and actually is part of the instrument's multi-position range switch. When toggle action occurs, for example, when S1B moves from position 2 (−Vs) to position 1 (+Vs), a positive trigger signal of peak value $2V_s$ is effectively applied to the gate of transistor Q3 as the impressed unit step signal undergoes differentiation in the network comprising resistor R11 and capacitor C3. This causes a rapid turn-on of transistor Q3 and saturation of transistor Q4 with point P (the upper end of armature coil 18) being momentarily connected to nearly the negative supply potential (−Vs). The resulting negative current flowing through coil 18 causes the contacts of reed relay 11 to close and remain latched, even though transistors Q3 and Q4 now return to their "off" condition, thereby blocking further current flow. The pulse duration (Q4 saturation) depends on the magnetic device (i.e., coil 18) and the series resistance and circuit parameters, as follows:

$$t_{on} = R_{11} C_3 \ln \left[ \frac{2V_s}{V_{BE(on)} + V_{GS(th)} + V_{(Q)}} \right] (\text{sec}) \quad (1)$$

with $$V_{(Q)} = \sqrt{\frac{2[V_s - V_{CE(sat)}]}{h_{FE} \times \beta \times R_L}} \quad (V) \quad (2)$$

where
$V_s$ = Supply Voltage (V)
$V_{BE(on)}$ = Voltage drop of the forward - biased, base-emitter junction of (bipolar) transistor Q2 or Q4 (V)
$V_{CE(sat)}$ = Voltage drop (collector-emitter) of saturated transistor Q2 or Q4 (V)
$h_{FE}$ = Forward current transfer ratio (static current gain, common emitter) of transistor Q2 or Q4
$V_{GS(th)}$ = Gate-Source threshold voltage of enhancement type MOSFET Q1 or Q3 (V)
$\beta$ = Gain Factor (mhos/V) of MOSFET Q1 or Q3
$R_L$ = Load resistance of the magnetic device (coil 18) and series resistance, if any (Ohms)

The inductive time constant ($L/R_L$) of coil 18 is not considered in Equation (1), as it is generally negligible compared to $t_{on}$. The fall time of the pulse is comparatively much longer than the rise time, due to the exponentially decaying gate voltage and the square law characteristics of MOSFET drain current as a function of gate-source voltage. Pulse shape itself is not of particular concern in this application, however, so long as the device drive requirements are satisfied and pulse duration is not unduly excessive to minimize energy demand during switching (approximately $(V_s^2/R_L) \times t_{on}$ Joules per pulse).

Unlatching of the magnetic device is accomplished by analogous circuit action when switch S1B is moved from position 1 ($+V_s$) back to position 2 ($-V_s$), thus causing a positive current pulse through the coil of the magnetic device which restores it to its original open contact state. The pulse duration is again governed by Equations (1) and (2) with the parameters for transistors Q1 and Q2 applicable instead of transistors Q3 and Q4. In the quiescent state, without actuation of switch S1B, the circuitry consumes no power (disregarding negligible leakage currents). Instead of deriving the trigger signal from a physical switch, the circuit may, of course, be triggered with a square wave input of suitable amplitude and rise time, for example, from a pulse source or the output from a linear circuit such as comparator. Depending on the design of relay coil 18 and the magnetic characteristics of the device, i.e., the ampere-turns required for latching and unlatching, current limiting resistor R13 and balancing resistor R14 may be required to ensure reliable operation at a given supply voltage. Resistors R10 and R12 are protective, current-limiting resistors.

As previously discussed, the toggle circuit of FIG. 2 is particularly suited for use in radiation survey meters of the type that employ operational electrometers and where a manual range switch and a bipolar power supply (e.g., ±12V) are provided. The use of a glass-encapsulated magnetic reed relay is definitely advantageous here as it acts as remotely-controllable, high-impedance switch which can be physically sealed (i.e., "RTV potted") into the detector module. This prevents compromise of the high valued range resistors which are also sealed into the module rendering them free from external contamination even under the most severe environmental conditions, e.g., humidity, salt fog, et cetera. Up to now, such reed relay range switching was only feasible in instrumentation operating with ample battery or a.c. line power; or by the use of a mechanical linkage arranged to rotate a small permanent magnet to actuate one or more reed relays in physical proximity to the magnet. A radiation-activated sensor employing an ionchamber detector and a conventional reed relay with extremely low power demand has been described in the literature. However, the reed relay in that system was used for momentary contact closure only, i.e., in a pulse mode. For steady-state operation, such as a long-time contact closure in the case of a range switch, the power requirement of a conventional reed relay is usually unacceptable for battery-powered equipment. A latching-type reed relay, coupled with the toggle circuit shown in FIG. 2, overcomes the power demand or mechanical linkage problems of conventional reed relays and affords the advantages of this high impedance switch in compact, portable instruments that may operate on a small battery or even on solar power.

The previously discussed circuit of FIG. 1 illustrates the principle of this high impedance range switch in an ion chamber/electrometer type radiacmeter. The FET-electrometer operates as a current-to-voltage converter with 100% negative feedback via high value resistors R1 and R2. The range switch controls the latching relay contact such that for very high signal current (1000 Rad/h range) resistor R1 is shorted and the total feedback resistance reduced by 91% to prevent amplifier saturation. A prototype of such a radiacmeter was designed and built utilizing an efficient DC converter. With a small (20 cm²) silicon solar cell, the radiacmeter can operate directly on solar power as the circuit requires only 5 mW with a rechargeable NiCd battery for rainy days. A further conceivable application and extension of this invention is automatic range switching, at low power demand, whereby the toggle circuit and relay are controlled by a comparator circuit, depending upon the output voltage (full scale range) of the electrometer. Apart from latching relay, the toggle circuit disclosed here is also readily adapted to momentarily energize miniature, magnetically bistable status indicators, such as the two-color ball display device manufactured by the MINELCO Company used as a Built-In Test Equipment Indicator (BITE). It may also be used as a visual status, scale range or alarm indicator and with the circuit of FIG. 2 is particularly suited for low power, portable equipment.

It should be noted that such low-power (or virtually zero power) continuous displays are not obtainable with self-lighting (incandescent, LED or Neon) devices. It is also noteworthy that miniature "BITE" indicators are available with ratings for severe environmental conditions (e.g., to withstand 10 G's of vibration, and a −65° to +125° C operating temperature range). Similarly, the miniature reed relay used in the experimental prototype was rated to withstand up to 50 G's vibration (below 3 KHz) and extreme temperatures (−180° to +200° C). Although the experimental circuit of FIG. 1 was assembled and tested with discrete components only, conversion into a hybrid integrated circuit package is entirely feasible, for utmost physical size compression.

One skilled in the art may make various changes and substitutions to the layout of parts shown without departing from the spirit and scope of the invention.

What I claim is:

1. An electrometer which comprises: an operational amplifier having an input connected to the source of the current to be measured, and an output;
    means for applying a feedback signal from the output of said operational amplifier to the input to control the gain thereof, said feedback applying means including at least first and second feedback resistors serially connected in a feedback loop between said output and input;
    means connected to the output of said operational amplifier for indicating the amplitude of the output signal therefrom;
    means for supplying first and second potentials of opposite polarities;
    means for altering the sensitivity of said indicating means thereby to provide a plurality of measurement ranges for said electrometer; and
    polarity sensitive switching means activated by the operation of said sensitivity altering means to selectively short out at least one of said first and second resistors to change the gain of said operational amplifier, said sensitivity altering means including means for selectively applying said opposite potential polarities to said switching means.

2. The apparatus according to claim 1 wherein said switching means comprises:
    a latching reed relay connected across at least one of said first and second resistors;
    an armature coil associated with said reed relay for altering the state of the contacts thereof;

and circuit means for selectively applying momentary current pulses to said coil of a polarity appropriate to alter the then current state of said relay contacts.

3. The apparatus according to claim 2 wherein said circuit means comprises:
first and second oppositely poled transistors having their emitters respectively connected to opposite polarity potentials and their collectors connected to ground via said armature coil; and
first and second oppositely poled MOSFET transistors having their source electrodes respectively connected to the bases of said first and second transistors, their drain electrodes connected to ground and their gates respectively connected to the midpoints of a pair of R-C differentiating circuits interconnecting respective said opposite polarity potentials and said means for selectively applying said potentials.

4. The apparatus of claim 1
wherein said switching means includes an armature selectively connectable to either of said first and second potentials of opposite polarities, a relay coil, and a circuit for applying a momentary pulse of current to said coil, said circuit including
a first R-C differentiating circuit interconnecting said potential of one polarity with said armature,
a second R-C differentiating circuit interconnecting said potential of a second polarity with said armature,
a p-channel MOSFET transistor having a gate connected to the midpoint of said first R-C differentiating circuit, a drain electrode connected to ground, and a source electrode;
a PNP transistor having an emitter connected to said potential of one polarity, a collector connected via said relay coil to ground, and a base connected to the source electrode of said p-channel MOSFET transistor;
an n-channel MOSFET transistor having a gate connected to the midpoint of said second R-C differentiating circuit, a drain electrode connected to ground, and a source electrode; and an NPN transistor having an emitter connected to said potential of the second polarity, a collector connected via said relay coil to ground, and a base connected to the source electrode of said n-channel MOSFET.

5. The apparatus of claim 2 wherein said switching means includes
electrostatic shielding means connected to ground potential and interposed between said armature coil and said reed relay; and
magnetic shielding means surrounding said armature coil and reed relay.

* * * * *